United States Patent
Lin (10) Patent No.: US 10,439,042 B2
(45) Date of Patent: Oct. 8, 2019

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jing Lin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/829,453

(22) Filed: Dec. 1, 2017

(65) Prior Publication Data
US 2018/0158929 A1    Jun. 7, 2018

(30) Foreign Application Priority Data

Dec. 2, 2016 (CN) .......................... 2016 1 1110266

(51) Int. Cl.
*H01L 21/033* (2006.01)
*H01L 29/66* (2006.01)
*H01L 21/3213* (2006.01)
*H01L 29/78* (2006.01)
*H01L 29/423* (2006.01)

(52) U.S. Cl.
CPC .... *H01L 29/66545* (2013.01); *H01L 21/0332* (2013.01); *H01L 21/32133* (2013.01); *H01L 21/32139* (2013.01); *H01L 29/42316* (2013.01); *H01L 29/66636* (2013.01); *H01L 29/66795* (2013.01); *H01L 29/7848* (2013.01); *H01L 29/7851* (2013.01)

(58) Field of Classification Search
CPC ......... H01L 29/66545; H01L 29/42316; H01L 21/0332; H01L 29/7848; H01L 29/66795; H01L 29/66636; H01L 21/32133; H01L 21/32139; H01L 29/7851
See application file for complete search history.

(56) References Cited

U.S. PATENT DOCUMENTS

| | | | |
|---|---|---|---|
| 6,548,423 | B1 | 4/2003 | Plat et al. |
| 6,864,556 | B1 | 3/2005 | You et al. |
| 7,109,101 | B1 | 9/2006 | Wright et al. |

(Continued)

OTHER PUBLICATIONS

The European Patent Office (EPO) The Extended European Search Report for 17204259.0 dated May 16, 2018 8 Pages.

*Primary Examiner* — David Vu
(74) *Attorney, Agent, or Firm* — Anova Law Group, PLLC (57) ABSTRACT

A semiconductor device and a fabrication method are provided. The method includes providing a substrate; forming a gate structure film on the substrate; forming a patterned mask structure on the gate structure film, where the patterned mask structure includes a first mask layer at least including a first material layer and a second mask layer on the first mask layer; forming a gate structure on the substrate by etching the gate structure film using the patterned mask structure as an etch mask, where the first material layer has an etching rate smaller than the second mask layer; and forming a spacer at least on a sidewall of the gate structure.

20 Claims, 7 Drawing Sheets

(56) References Cited

U.S. PATENT DOCUMENTS

| | | | |
|---|---|---|---|
| 8,372,755 B2* | 2/2013 | Wang | H01L 21/823807 |
| | | | 257/287 |
| 9,337,254 B1* | 5/2016 | Basker | H01L 27/0629 |
| 2009/0101977 A1 | 4/2009 | Iwamatsu et al. | |
| 2009/0158999 A1 | 6/2009 | Vogt | |
| 2015/0034899 A1 | 2/2015 | Ching et al. | |
| 2015/0357440 A1 | 12/2015 | Cheng et al. | |
| 2016/0189970 A1 | 6/2016 | Huang et al. | |

\* cited by examiner

SEMICONDUCTOR DEVICE AND FABRICATION METHOD THEREOF

CROSS-REFERENCES TO RELATED APPLICATIONS

This application claims priority of Chinese Patent Application No. 201611110266.7, filed on Dec. 2, 2016, the entire contents of which are hereby incorporated by reference.

FIELD OF THE INVENTION

The present disclosure generally relates to the field of semiconductor manufacturing and, more particularly, relates to a semiconductor device and a fabrication method thereof.

BACKGROUND

A metal-oxide-semiconductor (MOS) transistor is one of the most important elements in modern integrated circuits. The basic structure of a MOS transistor includes a semiconductor substrate; a gate structure on the semiconductor substrate. The gate structure includes a gate dielectric layer on the surface of the semiconductor substrate and a gate electrode layer on the surface of the gate dielectric layer; and doped source and drain regions in the semiconductor substrate on both sides of the gate structure.

A conventional planar MOS transistor has weak control capability on the channel current with respect to the development of semiconductor technology, causing serious leakage current. A fin field effect transistor (Fin FET) is an emerging multi-gate device which generally includes a fin that protrudes from the surface of the semiconductor substrate; a gate structure covering a portion of the top surface and a portion of sidewall of the fin; and doped source and drain regions in the fin on both sides of the gate structure.

However, performance of the semiconductor devices of conventional MOS transistors and fin field effect transistors still needs to be improved.

The disclosed method for fabricating a semiconductor device is directed to solve one or more problems set forth above and other problems in the art.

BRIEF SUMMARY OF THE DISCLOSURE

One aspect of the present disclosure provides a method for fabricating a semiconductor device. The method includes providing a substrate; forming a gate structure film on the substrate; forming a patterned mask structure on the gate structure film, where the patterned mask structure includes a first mask layer at least including a first material layer and a second mask layer on the first mask layer; forming a gate structure on the substrate by etching the gate structure film using the patterned mask structure as an etch mask, where the first material layer has an etching rate smaller than the second mask layer; and forming a spacer on a sidewall of the gate structure.

Another aspect of the present disclosure provides a semiconductor device. The semiconductor device includes a substrate; a gate structure on the substrate; a first mask layer including one or more mask units on the gate structure, each mask unit including a first material layer and a second material layer on the first material layer; a second mask layer on the first mask layer, wherein the second mask layer is made of a material having an etching rate greater than the first material layer in the first mask layer; and a spacer at least covering a sidewall of the gate structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The objects, features and advantages of the present disclosure can be understood by those skilled in the art through the exemplary embodiments of the present disclosure, and can be further described in detail with reference to the accompanying drawings.

FIGS. 1-4 illustrate a fabrication method of a semiconductor device.

Figure 1:
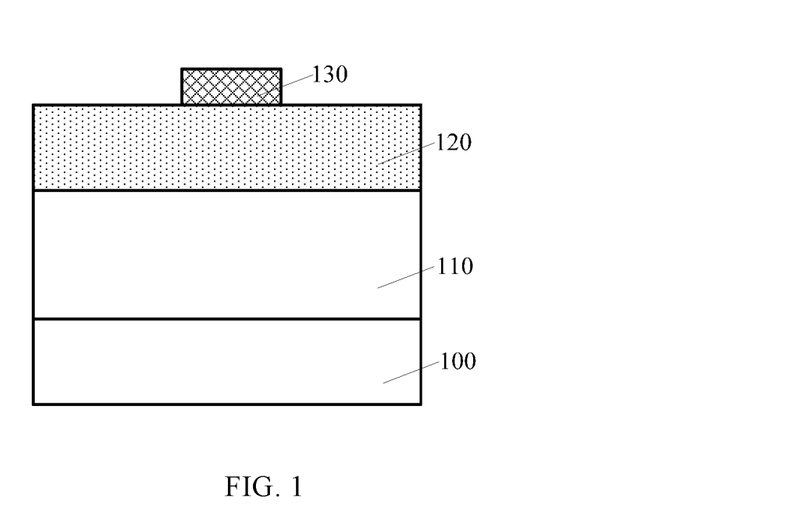
FIGS. 1-4 illustrate a fabrication method of a semiconductor device.

As shown in FIG. 1, the fabrication method may begin with: providing a semiconductor substrate 100 having a fin 110 on the semiconductor substrate 100, forming a dummy gate structure film 120 on the semiconductor substrate 100 to cover the fin 110, and forming a patterned mask layer 130 on the dummy gate structure film 120.

Figure 2:
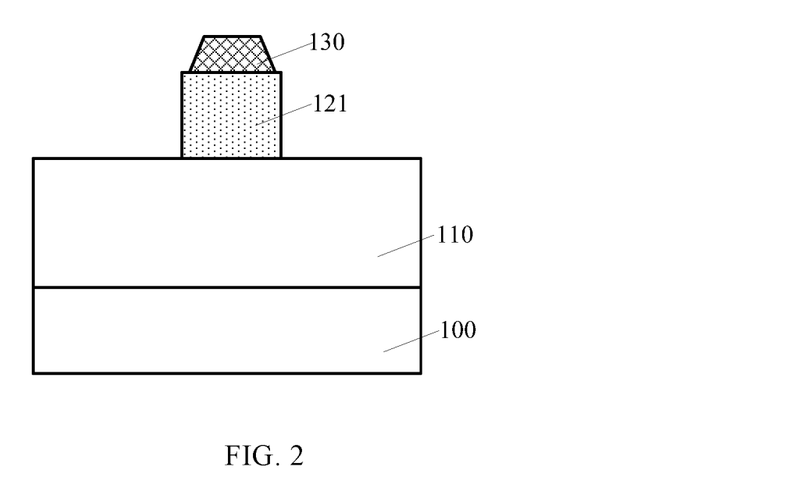

As shown in FIG. 2, the fabrication method may further include: etching the dummy gate structure film 120 (referring to FIG. 1) by using the mask layer 130 as an etch mask to form a dummy gate structure 121 across the fin 110.

Figure 3:
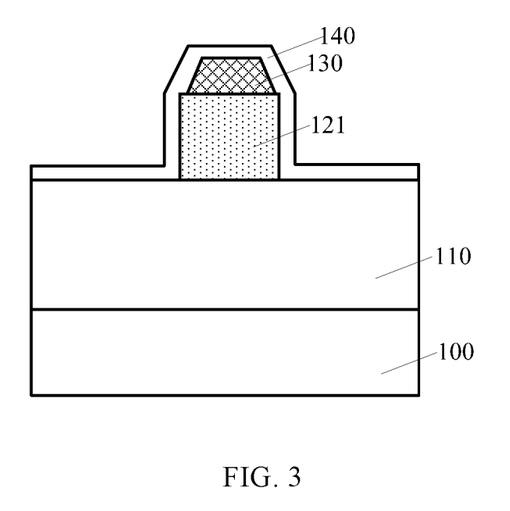

As shown in FIG. 3, the fabrication method may further include: forming a spacer film 140 covering the semiconductor substrate 100, the fin 110, and the dummy gate structure 121.

Figure 4:
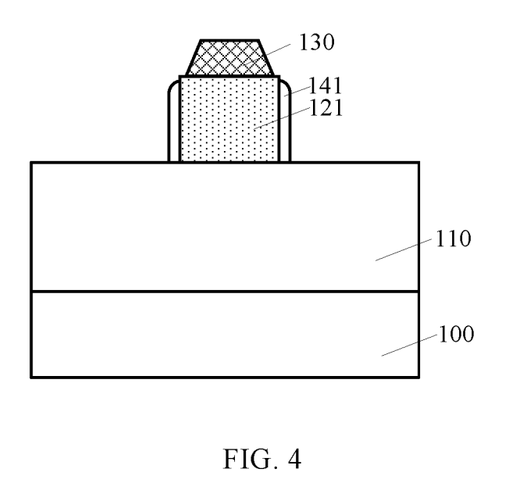

As shown in FIG. 4, the fabrication method may further include: etching back the spacer film 140 to form a spacer 141 on the sidewall of the dummy gate structure 121.

However, the semiconductor device formed by the fabrication method set forth above in FIGS. 1-4 may have a leakage current for the following reasons.

In the process of etching the dummy gate structure film 120 with the mask layer 130 as a mask to form the dummy gate structure 121, the sidewall of the mask layer 130 may be etched. Because of the etching rate of the mask layer 130 with respect to the etching rate of the dummy gate structure film 120, the mask layer 130 may not withstand the etching loss. Thus, the etching loss to the mask layer 130 may be substantial. Accordingly, the mask layer 130 may expose the edge of the top surface of the dummy gate structure 121, or the thickness of the mask layer 130 at the top edge of the dummy gate structure 121 may be substantially thin.

In addition, in the process of etching back the spacer film 140, the etching-back may mainly happen in a direction perpendicular to the surface of the semiconductor substrate 100, thus the top of the sidewall of the dummy gate structure 121 may be easily exposed. If the mask layer 130 exposed the edge of the top surface of the dummy gate structure 121, the edge of the top surface of the dummy gate structure 121 may also be easily exposed in the process of etching back the spacer film 140. Accordingly, the protective effect of the patterned mask layer 130 and the spacer 141 on the dummy gate structure 121 may be reduced, causing leakage current in the semiconductor device.

Figure 12:
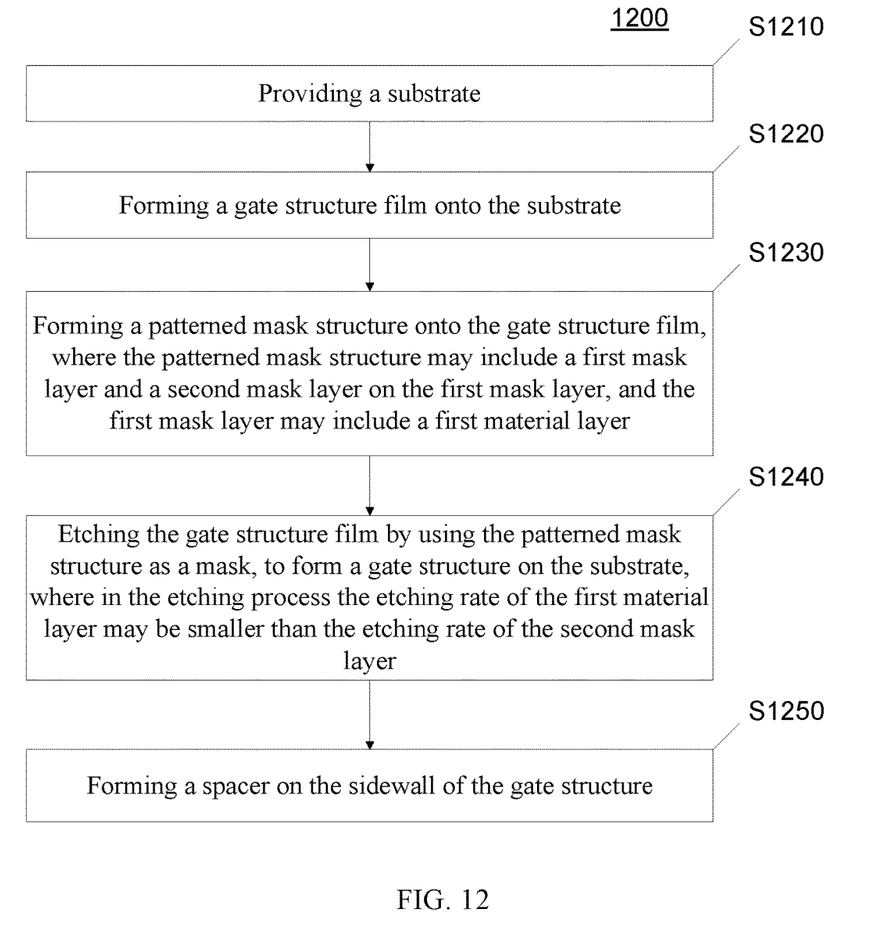
FIG. 12 illustrates a flow chart of an exemplary method for fabricating an exemplary semiconductor device consistent with various disclosed embodiments.

The present disclosure provides a semiconductor device and a method for fabricating the semiconductor device. FIG. 12 illustrates a flow chart of an exemplary method for fabricating an exemplary semiconductor device consistent with disclosed embodiments. As shown in FIG. 12, the method may include: at S1210, providing a substrate; at S1220, forming a gate structure film onto the substrate; at S1230, forming a patterned mask structure onto the gate structure film, where the patterned mask structure may include a first mask layer and a second mask layer on the first mask layer, and the first mask layer may include a first material layer; at S1240, etching the gate structure film by using the patterned mask structure as a mask, to form a gate structure on the substrate, where in the etching process the etching rate of the first material layer may be smaller than the etching rate of the second mask layer; and at S1250, forming a spacer on the sidewall of the gate structure.

Because the etching rate of the first material layer may be smaller than the etching rate of the second mask layer during the etching of the gate structure film with the patterned mask structure as a mask, the first material layer may have less etching loss than the second mask layer. Thus, after the gate structure is formed, the top edge of the gate structure may be completely covered by the first mask layer, and the first mask layer covering the edge of the top surface of the gate structure may be substantially thick. Because the spacer may be formed on the sidewall of the gate structure and the sidewall of the first mask layer in a direction perpendicular to the surface of the semiconductor substrate, the spacer and the first mask layer may not expose the top of the sidewall and the edge of the top surface of the gate structure. Accordingly, the protective effect of the patterned mask structure and the spacer on the gate structure may be improved, suppressing leakage current in the semiconductor device.

FIGS. 5-11 illustrate an exemplary fabrication method of an exemplary semiconductor device consistent with disclosed embodiments.

Figure 5:
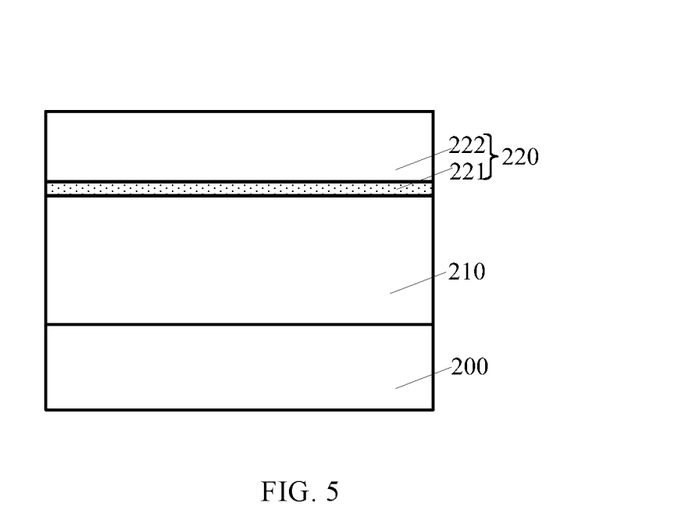
FIGS. 5-11 illustrate an exemplary fabrication method of an exemplary semiconductor device consistent with various disclosed embodiments.

As shown in FIG. 5, the fabrication method may begin with providing a substrate.

In various embodiments, the substrate may include a semiconductor substrate 200 and a fin 210 located on the semiconductor substrate 200. In other embodiments, the substrate may be a planar semiconductor substrate.

In various embodiments, the material of the semiconductor substrate 200 may include single-crystal silicon. In certain embodiments, the semiconductor substrate may include polycrystalline silicon or amorphous silicon. In other embodiments, the material of the semiconductor substrate may include germanium, silicon germanium, gallium arsenide, or any suitable semiconductor.

In various embodiments, the fin 210 may be formed by patterning the semiconductor substrate 200. In other embodiments, the fin 210 may be formed by forming a fin material layer onto the semiconductor substrate and patterning the fin material layer.

In various embodiments, the semiconductor substrate 200 between the adjacent fins 210 may have an isolation structure (not shown). The surface of the isolation structure may be lower than the top surface of the fin 210. The isolation structure may be used to electrically isolate the adjacent fins 210.

The material of the isolation structure may include silicon oxide and/or silicon oxycarbide.

Referring back to FIG. 5, the fabrication method may further include forming a gate structure film 220 on the substrate. In one embodiment, the gate structure film 220 is used to subsequently form a gate structure for forming a semiconductor device. In another embodiment, the gate structure film 220 may be a dummy gate structure film used to form a dummy gate structure for forming a semiconductor device.

The gate structure film 220 may include a gate dielectric film 221 on the substrate and a gate electrode film 222 on the gate dielectric film 221.

For example, the gate dielectric film 221 may cover the surface of the fin 210; and the gate electrode film 222 may be located on the isolation structure and the gate dielectric film 221.

In one embodiment, the gate dielectric film 221 may cover only the surface of the fin 210. Accordingly, the gate dielectric film 221 may be formed an oxidation process, such as a wet oxidation process or a dry oxidation process.

In another embodiment, the gate dielectric film 221 may cover the surface of the fin 210 and the surface of the isolation structure. Accordingly, the gate dielectric film 221 may be formed by a deposition process such as a plasma chemical vapor deposition process, an atomic layer deposition process, a subatmospheric chemical vapor deposition process, or a low pressure chemical vapor deposition process.

The gate electrode film 222 may be formed by a deposition process such as a plasma chemical vapor deposition process, an atomic layer deposition process, a subatmospheric chemical vapor deposition process, or a low pressure chemical vapor deposition process.

In one embodiment, the material of the gate dielectric film 221 may include a silicon oxide or a high-K dielectric material (K may be greater than approximately 3.9), and the material of the gate electrode film 222 may include polycrystalline silicon, e.g., for forming a dummy gate structure. In another embodiment, the material of the gate dielectric film 221 may include a high-K dielectric material, and the material of the gate electrode film 222 may include a metal, e.g., for forming a gate structure.

The fabrication method may further include forming a patterned mask structure onto the gate structure film 220, where the patterned mask structure may include a first mask layer and a second mask layer on the first mask layer, and the first mask layer may include a first material layer.

In various embodiments, the first mask layer may include one or more mask units on the gate structure film 220. Each mask unit may include a first material layer and a second material layer on a surface of the first material layer. When the quantity of the mask units is more than one, the mask units may be stacked in a direction perpendicular to the surface of the semiconductor substrate 200.

In other embodiments, the first mask layer may include only one or more first material layers.

Figure 6:
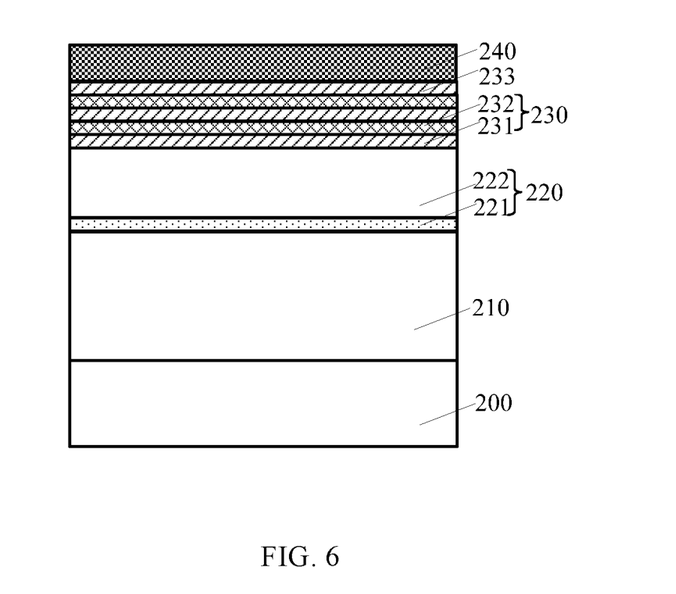
Figure 7:
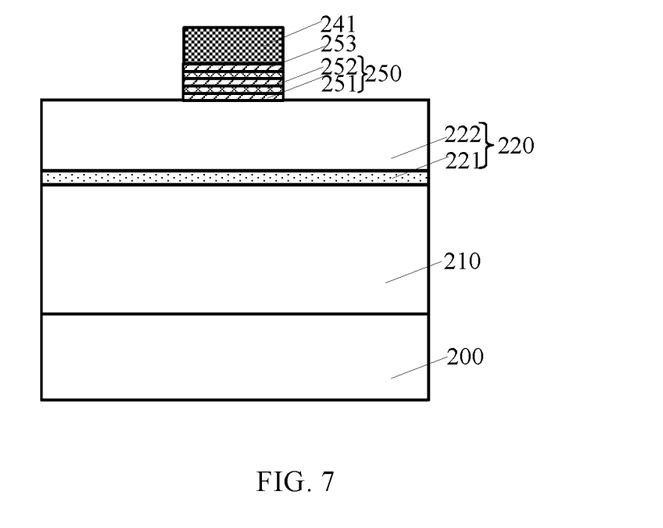

FIGS. 6-7 illustrate an exemplary method of forming an exemplary patterned mask structure.

As shown in FIG. 6, the method may include: forming a first initial mask layer on the gate structure film 220, and forming a second initial mask layer 240 on the first initial mask layer. The first initial mask layer may include one or more initial mask units 230, and each initial mask unit 230 may include a first film 231 and a second film 232 on the surface of the first film 231. When the quantity of the initial mask units 230 is more than one, the initial mask units 230 may be stacked in a direction perpendicular to the surface of the semiconductor substrate 200.

The initial mask unit 230 may be used to subsequently form a mask unit; the first film 231 may be used to subsequently form a first material layer; and the second film 232 may be used to subsequently form a second material layer.

The first film 231, the second film 232, and the second initial mask layer 240 may be formed by a deposition process such as a plasma chemical vapor deposition process, an atomic layer deposition process, a low pressure chemical vapor deposition process, or an atmospheric pressure chemical vapor deposition process.

The material of the first film 231 may include silicon oxide, silicon oxynitride, and/or silicon oxycarbonitride.

The material of the second film 232 may include silicon nitride, silicon oxynitride, and/or silicon carbonitride.

The thickness of each first film 231 may be approximately 10 angstroms to 500 angstroms, and the thickness of each second film 232 may be 10 angstroms to 500 angstroms.

The material of the second initial mask layer 240 may include silicon nitride, silicon oxynitride, and/or silicon carbonitride.

The quantity of the first films 231 in the first initial mask layer may be 1-layer to 5-layer.

In various embodiments, the first initial mask layer may further include a third film 233 between the one or more initial mask units 230 and the second initial mask layer 240.

The third film 233 may be used to subsequently form a third material layer.

The third film 233 may have the same material as the first film 231.

The thickness of the third film 233 may be, for example, approximately 10 angstroms to 500 angstroms.

The third film 233 may be formed by a deposition process such as a plasma chemical vapor deposition process, an atomic layer deposition process, a low pressure chemical vapor deposition process, or an atmospheric pressure chemical vapor deposition process.

Referring to FIG. 7, the method may further include: patterning the second initial mask layer 240 and the first initial mask layer, to form a first mask layer on the gate structure film 220 and a second mask layer 241 on the first mask layer. The first mask layer, and the second mask layer 241 may form a patterned mask structure.

The first mask layer may include one or more mask units 250 on the gate structure film 220. Each mask unit 250 may include a first material layer 251 and a second material layer 252 on the surface of the first material layer 251. When the quantity of the mask units 250 are more than one, the mask units 250 may be stacked in a direction perpendicular to the surface of the semiconductor substrate 200.

When the first initial mask layer further includes a third film 233, the first mask layer may also include a third material layer 253.

The second mask layer 241 may correspond to the second initial mask layer 240.

In various embodiments, the etching rate of the second film 232 may be greater than or equal to the etching rate of the second initial mask layer 240 during the patterning of the second initial mask layer 240 and the first initial mask layer.

Because the etching rate of the second film 232 is greater than or equal to the etching rate of the second initial mask layer 240 during the patterning of the second initial mask layer 240 and the first initial mask layer, the second film 232 may be patterned more easily. Accordingly, the first initial mask layer may be patterned more easily.

For example, during the patterning of the second initial mask layer 240 and the first initial mask layer, the etching rate of the second film 232 may be approximately 100% to 120% of the etching rate of the second initial mask layer 240. The range of 100% to 120% may be selected, because, when the etching rate of the second film 232 is too large with respect to the etching rate of the second initial mask layer 240, the loss of the second film 232 may be too large during the patterning of the second initial mask layer 240 and the first initial mask layer. Accordingly, the second material layer 252 may not be able to support the first material layer 251, if the etching rate of the second film 232 is too large with respect to the etching rate of the second initial mask layer 240.

The material of the first material layer 251 may include silicon oxide, silicon oxynitride, and/or silicon oxycarbonitride.

The material of the second material layer 252 may include silicon nitride, silicon oxynitride, and/or silicon carbonitride.

The material of the third material layer 253 may be the same as the material of the first material layer 251.

The thickness of each first material layer 251 may be approximately 10 angstroms to 500 angstroms, and the thickness of each second material layer 252 may be approximately 10 angstroms to 500 angstroms. The thickness of the third material layer 253 may be approximately 10 angstroms to 500 angstroms.

The quantity of the first material layer 251 in the first mask layer may be 1 to 5.

The material of the second mask layer 241 may include silicon nitride, silicon oxynitride, and/or silicon carbonitride.

Figure 8:
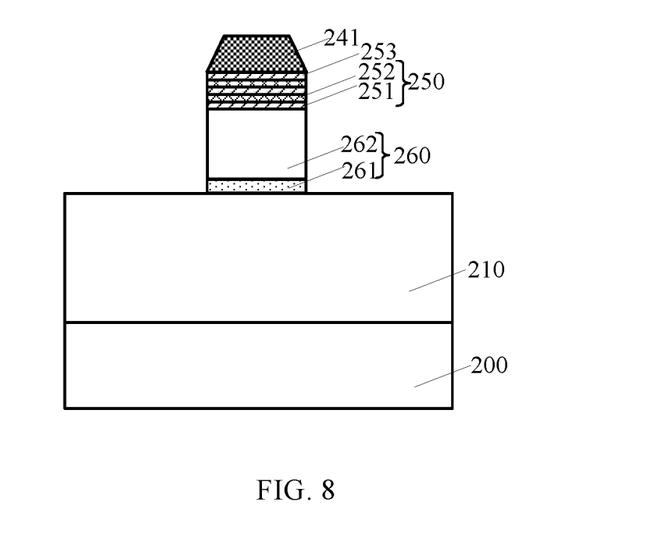

Referring to FIG. 8, the fabrication method may further include etching the gate structure film 220 (refer to FIG. 7) with the patterned mask structure as a mask, to form a gate structure 260 is on the substrate. In the etching process, the etching rate of the first material layer 251 may be smaller than the etching rate of the second mask layer 241.

In various embodiments, the gate structure 260 may span the fin 210, and may cover a portion of the top surface and a portion of the sidewall of the fin 210. The gate structure 260 may include a gate dielectric layer 261 and a gate electrode layer 262. The gate dielectric layer 261 may cover a portion of the top surface and a portion of the sidewall surface of the fin 210. The gate electrode layer 262 may be located on a portion of the isolation structure and the gate dielectric layer 261.

The gate dielectric layer 261 may correspond to the gate dielectric film 221, and the gate electrode layer 262 may correspond to the gate electrode film 222.

When the gate dielectric film 221 covers only the surface of the fin 210, the gate dielectric layer 261 may cover a portion of the top surface and a portion of the sidewall surface of the fin 210. Accordingly, the gate electrode layer 262 may be located on a portion of the isolation structure and the gate dielectric layer 261.

When the gate dielectric film 221 covers the surface of the fin 210 and the surface of the isolation structure, the gate dielectric layer 261 may cover a portion of the top surface and a portion of the sidewall surface of the fin 210 and the surface of a portion of the isolation structure. The gate dielectric layer 261 may be located between the isolation structure and the gate electrode layer 262, and between the fin 210 and the gate electrode layer 262.

Because the etching rate of the first material layer 251 may be smaller than the etching rate of the second mask layer 241 during the etching of the gate structure film 220 with the patterned mask structure as a mask, the etching loss of the material layer 251 may be less than the etching loss of the second mask layer 241. Accordingly, after the gate structure 260 is formed, the top edge of the gate structure 260 may be completely covered by the first mask layer, and the first mask layer covering the edge of the top surface of the gate structure 260 may be substantially thick.

If the etching rate of the first material layer 251 is too small with respect to the etching rate of the second mask layer 241 during the etching of the gate structure film 220 with the patterned mask structure as a mask, the process difficulty may be increased. If the etching rate of the first material layer 251 is too large with respect to the etching rate of the second mask layer 241 during the etching of the gate structure film 220 with the patterned mask structure as a mask, the blocking effect of a material layer 251 on etching may be substantially weak. Thus, in various embodiments, the etching rate of the first material layer 251 may be configured to be approximately 10% to 90% of the etching rate of the second mask layer 241 during the etching of the gate structure film 220 with the patterned mask structure as a mask.

The spacer may be formed on the sidewall of the gate structure 260.

Figure 9:
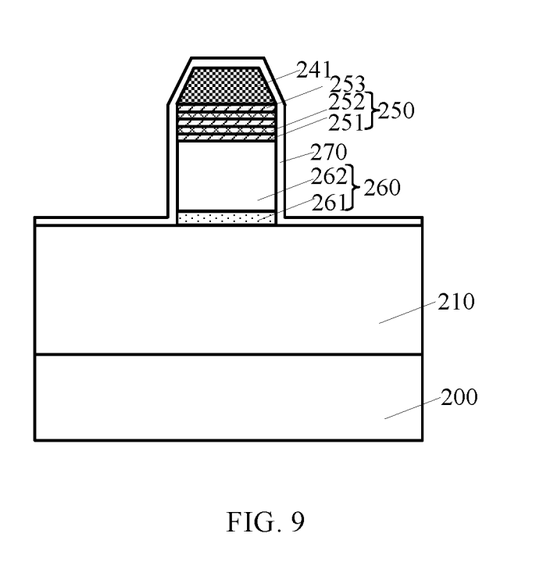

As shown in FIG. 9, the fabrication method may further include forming a spacer film 270. The spacer film may cover the substrate, the gate structure 260, and the patterned mask structure.

The material of the spacer film 270 may include silicon nitride, silicon oxynitride, and/or silicon carbonitride.

The spacer film 270 may be formed by a deposition process such as a plasma chemical vapor deposition process, a low pressure chemical vapor deposition process, a subatmospheric chemical vapor deposition process, or an atomic layer deposition process.

In various embodiments, the spacer film 270 may be formed by an atomic layer deposition process, such that the spacer film 270 may have a substantially good shape-preserving property. Accordingly, the thickness uniformity of the spacer film 270 may be substantially good.

Figure 10:
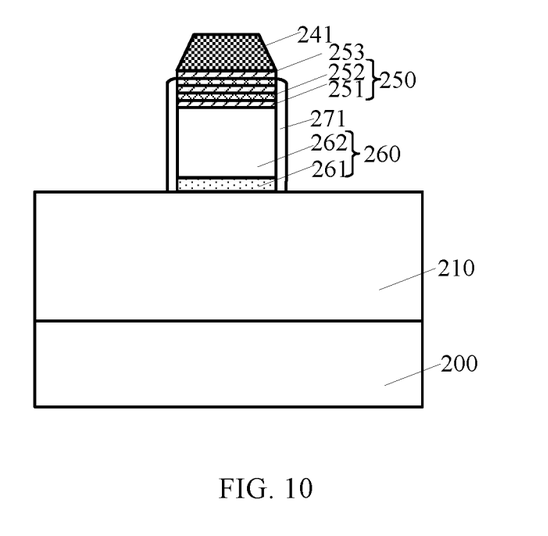

Referring to FIG. 10, the fabrication method may further include etching back the spacer film 270 to form a spacer 271 on the sidewall of the gate structure 260. That is, the spacer film 270 may be etched back to form a spacer 271 covering the sidewall of the gate structure 260.

The spacer film 270 may be etched back by an anisotropic etching process, such as an anisotropic dry etching process or a reactive ion etching process.

Because the top edge of the gate structure 260 may be covered by the first mask layer and the first mask layer covering the edge of the top surface of the gate structure 260 may be substantially thick, the spacer 271 may be formed, based on the spacer film 270 on the sidewall of the gate structure 260 and the sidewall of the first mask layer in a direction perpendicular to the surface of the semiconductor substrate 200. Accordingly, the spacer 271 and the first mask layer may not expose the top of the sidewall of the gate structure 260 and the edge of the top surface of the gate structure 260. In various embodiments, the spacer 271 may at least cover the sidewall of the gate structure. For example, the spacer 271 may further cover one or more layers, such as the mask units 250, in the first mask layer, as shown in FIG. 10. In another example, the spacer 271 may further cover the entire first mask layer including the third material layer or may further cover the entire first mask layer and the second mask layer.

Figure 11:
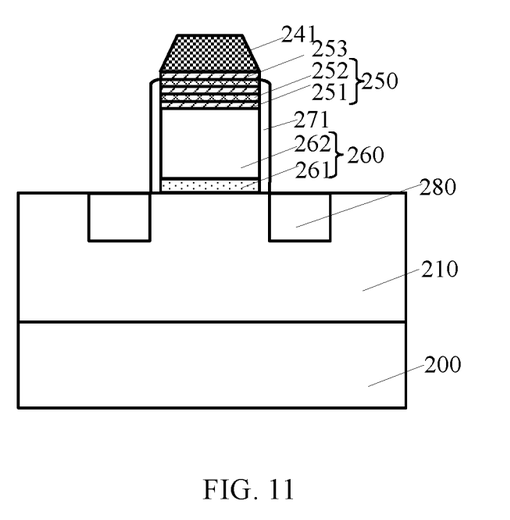

Referring to FIG. 11, the fabrication method may further include forming doped source and drain regions 280 in the substrate on both sides of the gate structure 260 and the spacer 271.

The method for forming the doped source and drain regions 280 may include: forming pits (not shown) in the substrate on both sides of the gate structure 260 and the spacer 271; and epitaxially growing source and drain material layers into the pits to form doped source and drain regions 280.

For example, pits may be formed in the fin 210 on both sides of the gate structure 260 and the spacer 271, and the doped source and drain regions 280 may be formed by epitaxially growing source and drain material layers into the pits.

Because the spacer 271 and the first mask layer may not expose the top of the sidewall of the gate structure 260 and the edge of the top surface of the gate structure 260, the protective effect of the patterned mask structure and the spacer 271 on the gate structure 260 may be improved. Accordingly, the materials for the doped source and drain regions 280 may not form at the top of the sidewall of the gate structure 260 and the edge of the top surface of the gate structure 260, during the formation of the doped source and drain regions 280. And leakage current in the semiconductor device may be suppressed.

The present disclosure provides a method for fabricating a semiconductor device including: providing a substrate; forming a gate structure film on the substrate; forming a patterned mask structure on the gate structure film, where the patterned mask structure may include a first mask layer and a second mask layer on the first mask layer, and the first mask layer may include a first material layer; etching the gate structure film with the patterned mask structure as a mask to form a gate structure on the substrate, where the etching rate of the etching process to the first material layer may be smaller than the etching rate for the second mask layer; and forming a spacer onto the sidewall of the gate structure. The method may at least suppress a leakage current in the semiconductor device.

In comparison with the conventional technologies, the present disclosure provides the technical solution having the following advantages.

In the disclosed method for fabricating a semiconductor device, a patterned mask structure is formed on the gate structure film. The patterned mask structure includes a first mask layer and a second mask layer on the first mask layer. The first mask layer includes a first material layer. Because the etching rate of the first material layer is smaller than the etching rate of the second mask layer during the etching of the gate structure film using the patterned mask structure as a mask, the etching loss of the first material layer is less than the etching loss of the second mask layer. Thus, after the gate structure is formed, the top edge of the gate structure can be covered by the first mask layer, and the first mask layer covering the edge of the top surface of the gate structure is substantially thick. Because a spacer can be formed on the sidewall of the gate structure and the sidewall of the first mask layer, where the sidewall of the first mask layer is in a direction perpendicular to the surface of the semiconductor substrate, the spacer and the first mask layer may not expose the top of the sidewall and the edge of the top surface of the gate structure. Accordingly, the protective effect of the patterned mask structure and the spacer on the gate structure is improved, and leakage current of the formed semiconductor device may be suppressed.

It should be noted that, in the present disclosure, the terms "more than one" and "a plurality of" refer to two, three, or more than three.

It is apparent that the described embodiments are some but not all of the embodiments of the present invention. The present invention is not limited to the described embodiments. Based on the disclosed embodiments, persons of ordinary skill in the art may make various changes and modifications consistent with the present disclosure, all of which are within the spirit and scope of the present invention. Further, in the present disclosure, the disclosed embodiments and the features of the disclosed embodiments may be combined under conditions without conflicts. The scope of the present disclosure is defined by the scope of the claims.

What is claimed is:

1. A method for fabricating a semiconductor device, comprising:
providing a substrate;
forming a gate structure film on the substrate;
forming a patterned mask structure on the gate structure film, wherein the patterned mask structure comprises a first mask layer at least comprising a first material layer directly on the gate structure, a second material layer formed on the first material layer, and a third material layer formed on the second material layer, and a second mask layer on the first mask layer;
forming a gate structure on the substrate by etching the gate structure film using the patterned mask structure as an etch mask, wherein the first material layer has an etching rate smaller than the second mask layer and the second material layer has an etching rate higher than the first material layer; and
forming a spacer at least on a sidewall of the gate structure, a sidewall of the first material layer and a sidewall of the second material layer, wherein a portion of a sidewall of the third material layer is exposed by the spacer.

2. The method according to claim 1, wherein:
the first mask layer includes one or more mask units stacked on the gate structure film in a direction perpendicular to a surface of the substrate; and
each mask unit includes the first material layer and the second material layer on the first material layer.

3. The method according to claim 2, wherein the patterned mask structure is formed by:
forming a first initial mask layer, including one or more initial mask units stacked on the gate structure film, wherein each initial mask unit includes a first film and a second film on the first film;
forming a second initial mask layer on the first initial mask layer; and
patterning the second initial mask layer and the first initial mask layer to form a first mask layer on the gate structure film and a second mask layer on the first mask layer, wherein at least one first mask layer and at least one second mask layer form the patterned mask structure.

4. The method according to claim 3, wherein:
the etching rate of the second film is equal to or greater than the etching rate of the second initial mask layer in a process of patterning the second initial mask layer and the first initial mask layer.

5. The method according to claim 4, wherein:
the etching rate of the second film is approximately 100% to 120% of the etching rate of the second initial mask layer in the process of patterning the second initial mask layer and the first initial mask layer.

6. The method according to claim 2, wherein:
the third material layer is located between the one or more mask units and the second mask layer, and the third material layer includes a same material as the first material layer, wherein the spacer covers sidewalls of the first material layer and the second material layer, and exposing sidewalls of the third material layer and the second mask layer.

7. The method according to claim 2, wherein:
a thickness of each first material layer in each mask unit is approximately 10 angstroms to 500 angstroms; and
a thickness of each second material layer in each mask unit is approximately 10 angstroms to 500 angstroms.

8. The method according to claim 2, wherein:
a material of the second material layer includes a silicon nitride, a silicon oxynitride, a silicon carbonitride, or a combination thereof.

9. The method according to claim 2, wherein:
the first mask layer includes a number from one to five first material layers.

10. The method according to claim 1, wherein:
a material of the first material layer includes a silicon oxide, a silicon oxynitride, a silicon oxycarbonitride, or a combination thereof; and
a material of the second mask layer includes a silicon nitride, a silicon oxynitride, a silicon carbonitride, or a combination thereof.

11. The method according to claim 1, wherein:
an etching rate of the first material layer is approximately 10% to 90% of the etching rate of the second mask layer, when etching the gate structure film using the patterned mask structure as the etch mask.

12. The method according to claim 1, wherein:
the gate structure film includes a gate dielectric film on the substrate and a gate electrode film on the gate dielectric film.

13. The method according to claim 12, wherein:
a material of the gate dielectric film includes a silicon oxide or a high-K dielectric material, and a material of the gate electrode film includes a polycrystalline silicon; or
the material of the gate dielectric film includes a high-K dielectric material, and the material of the gate electrode film includes a metal.

14. The method according to claim 1, wherein forming the spacer includes:
forming a spacer film covering the substrate, the gate structure, and the patterned mask structure; and
etching back the spacer film to form the spacer covering the sidewall of the gate structure.

15. The method according to claim 14, wherein:
the spacer film is etched back by an anisotropic etching process.

16. The method according to claim 1, further including:
forming pits in the substrate on both sides of the gate structure and the spacer; and
epitaxially growing source material layers and drain material layers in the pits to form a doped source region and a doped drain region.

17. The method according to claim 1, wherein:
the substrate is a planar semiconductor substrate.

18. The method according to claim 1, wherein:
the substrate includes a semiconductor substrate and a fin on the semiconductor substrate;

the gate structure spans the fin, and covers a portion of a top surface and a portion of a sidewall of the fin; and a doped source region and a doped drain region are formed in the fin on both sides of the gate structure and the spacer.

19. A semiconductor device, comprising:

a substrate;

a gate structure on the substrate;

a first mask layer including one or more mask units on the gate structure, each mask unit including a first material layer directly on the gate structure, a second material layer on the first material layer, and a third material layer formed on the second material layer;

a second mask layer on the first mask layer, wherein the second mask layer is made of a material having an etching rate greater than the first material layer in the first mask layer, wherein the second material layer has an etching rate higher than the first material layer; and a spacer at least covering a sidewall of the gate structure, a sidewall of the first material layer and a sidewall of the second material layer, wherein a portion of a sidewall of the third material layer is exposed by the spacer.

20. The semiconductor device according to claim 19, wherein the third material layer is formed on the one or more mask units.

\* \* \* \* \*